Figure 1:
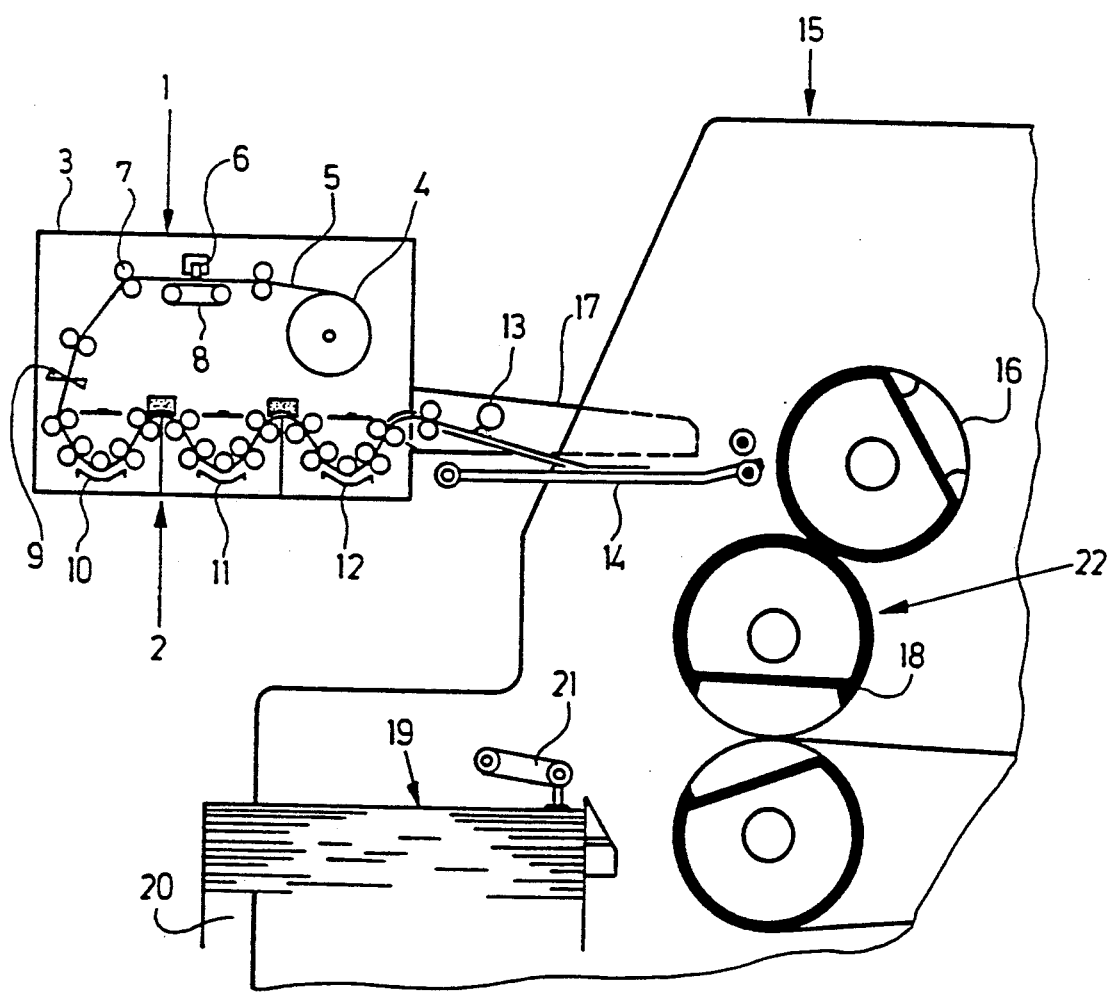

United States Patent [19]

Uhrig

[11] Patent Number: 5,094,933
[45] Date of Patent: Mar. 10, 1992

[54] PROCESS FOR FILMLESS PRODUCTION OF A PRINTING FORM

[75] Inventor: Rudolf Uhrig, Schriesheim, Fed. Rep. of Germany

[73] Assignee: Heidelberger Druckmaschinen, Heidelberg, Fed. Rep. of Germany

[21] Appl. No.: 532,375

[22] Filed: Jun. 4, 1990

[30] Foreign Application Priority Data

Jun. 3, 1989 [DE] Fed. Rep. of Germany ....... 3918216

[51] Int. Cl.$^5$ ............................................... G03F 7/00
[52] U.S. Cl. ..................................... 430/300; 430/396; 101/467
[58] Field of Search ............... 430/300, 396; 101/467; 355/1, 40, 70; 346/107 R

[56] References Cited

U.S. PATENT DOCUMENTS

| 3,678,852 | 7/1972 | Feinleib et al. | 101/465 |
| 3,952,311 | 4/1976 | Lapeyre | 354/5 |
| 4,435,064 | 3/1984 | Tsukada et al. | 355/1 |
| 4,876,569 | 10/1989 | Nishitoku | 355/68 |
| 4,919,045 | 4/1990 | Okudo et al. | 101/142 |

FOREIGN PATENT DOCUMENTS

| 0101266 | 2/1984 | European Pat. Off. |
| 1215513 | 12/1970 | United Kingdom | 101/142 |
| 2210829 | 6/1989 | United Kingdom |

Primary Examiner—Charles L. Bowers, Jr.
Assistant Examiner—Janis L. Dote
Attorney, Agent, or Firm—Herbert L. Lerner; Laurence A. Greenberg

[57] ABSTRACT

A process for filmless production of a ready-to-print printing form and for using it in an offset printing press includes exposing a printing form sensitive in an emission range of light-emitting diodes to an image in an exposure unit by means of a computer-controlled LED bar, passing the exposed printing form through a developing stage wherein the printing form is developed, and then feeding-in the printing form via a high-speed feeding-in device for printing forms, and positioning the fed-in printing form on a plate cylinder; and apparatus for performing the process.

1 Claim, 1 Drawing Sheet

PROCESS FOR FILMLESS PRODUCTION OF A PRINTING FORM

The invention relates to a process and an apparatus for filmless production of a ready-to-print printing form, especially for use on small offset printing presses.

The actual printing process in a printing press is preceded by the production of a printing form. Conventionally, the production of a printing form has been made up of several separate working steps, which are time-consuming and labor-intensive in relation to the actual printing process. Because the production of the printing form constitutes merely a preparation for the subsequent printing, although it is extremely important for the print quality, efforts are being made to minimize the amount of time and work involved.

An important step has been taken in this direction in that the photographic screen exposure of a film with subsequent film development and any necessary lithographic corrections is today largely replaced in reprotechnology or engineering by scanning the original, storing the data on data carriers, making corrections directly on the computer image and, then, copying the image onto a film by means of a laser beam. Furthermore, the exposed film (intermediate-copy carrier) serves as a "negative mask" for the printing form, and may possibly be an aluminum plate which has been coated with a photosensitive diazo-layer. In the vacuum printing frame, both thereof are exposed to intensive surface irradiation, the areas of the diazo-layer which are not covered by the film being hardened by a chemical reaction and becoming insoluble, so that, during subsequent developing, they remain as oleophilic locations on the hydrophilic aluminum plate.

It would be ideal if one could place the printing form directly on the plate cylinder of the printing press, whereby the separate operation for producing the printing form would be eliminated. Various efforts are being undertaken in this direction. Heretofore disclosed solutions, while making use of specific physical properties, are aimed at changing a special, hydrophilic, and thereby non-printing, plate-cylinder coating by applying energy in accordance with the form of the image, so that the treated locations become oleophilic and, accordingly, have a printing capability.

European Patent 0 101 266 proposes that a hydrophobic material be applied to a plate-cylinder coating formed of hydrophilic material. By a computer-controlled application of a laser, the hydrophobic coating is removed in accordance with the image by means of evaporation. At the end of the printing run, the coating or layer is scraped off. The printing cylinder must then be re-coated for the next printing job.

As described in two publications hereinafter, an attempt has been made to obviate the disadvantage that, after each printing job, the plate cylinder must be scraped clean and recoated.

In U.S. Pat. No. 3,678,852, there is presented a process wherein a plate cylinder is coated with a semiconductor material which, upon an application of energy by means of a laser, an electron beam or a heat source, can be reversibly switched between an amorphous oleophilic state and a crystalline hydrophilic state.

In European Patent 0 262 475, a plate cylinder is covered with a ferroelectric coating or foil, which is polarized or depolarized in accordance with scanned data by a computer-controlled application of electrodes or an electrode and a heat source, the polarized region being hydrophilic, while the depolarized region is oleophilic.

In addition to the aforementioned time saving, these processes of a direct imagewise deposit of the printing form on the plate cylinder have the advantage that deletion and rewrite operations can be performed on the plate in the printing press. Consequently, a printing form, is reusable and correctable, within limits. Setting-up times for mounting as well as precisely positioning the printing form on the plate cylinder are dispensed with.

In spite of the hereinafore-described advantages, these heretoforeknown processes have such considerable shortcomings and deficiencies that their application in practical day-to-day printing is not seriously under consideration at the present point in time. The principal reason therefor is that all of the special printing-form coatings, which have a physical state variable at will between oleophilic and hydrophilic by supplying energy thereto, without exception have the disadvantage of a short service life.

Semiconductor material, which has been proposed in U.S. Pat. No. 3,678,852 as a coating for the plate cylinder, in addition to being expensive, is brittle and in no way wear-resistant with respect to the rubber blanket of the impression cylinder, i.e. has only a limited reusability. Admixtures of other materials which increase the wear resistance and/or the adhesion on the plate cylinder itself result in a deterioration of the differentiation between ink-accepting (oleophilic) and ink-rejecting (hydrophilic) areas.

The foregoing applies as well to the ferroelectric coating material proposed in European Patent 0 262 475, with respect to which, due to the long-range, electrostatic forces, it appears even less likely that there would be adequate differentiation of the image.

A disadvantage common to the proposals disclosed heretofore is that the image-differentiating energy application, to a great extent, is accomplished by means of a computer-controlled laser beam. Because the laser is integrated directly into the printing press, the required mechanical parts, particularly the high-precision rotating mirror, the reflecting mirrors and the line systems of the laser, become unserviceable after a short period of time due to the occurrence of high-frequency vibrations during the operation of the printing press.

The production of printing forms without any intermediate-copy carrier has become known heretofore for small offset printing presses. Data scanned from an original is transmitted directly to a printing foil via a laser beam. This is followed by a developing step (Deutscher Drucker No. 9, 1988). Integration of this equipment into the printing press is not possible because of the aforementioned sensitivity of the optical devices of the laser It is accordingly an object of the invention to provide a process as well as an apparatus which ensures that, without any intermediate-copy carrier, a printing form, in accordance with the image, is produced directly on the printing press. The finished printing form is then automatically positioned on the plate cylinder and is printed.

With the foregoing and other objects in view, there is provided, in accordance with the invention, a process for filmless production of a ready-to-print printing form and for using it in an offset printing press, which comprises exposing a printing form sensitive in an emission range of light-emitting diodes to an image in an exposure unit by means of a computer-controlled LED bar, passing the exposed printing form through a developing stage wherein the printing form is developed, and then feeding-in the printing form via a high-speed feeding-in device for printing forms, and positioning the fed-in printing form on a plate cylinder.

In accordance with another aspect of the invention, there is provided, in combination, an apparatus for performing a process for filmless production of a ready-to-print printing form, and a printing press having a plate cylinder, the apparatus comprising an exposure unit and a developing unit disposed in a light-proof housing, said exposure unit comprising a computer-controlled LED bar, and being connected, together with said developing unit, by a feed table to the printing press, and a high-speed printing-form in-feeding device for positioning the printing form on the plate cylinder.

An essential advantage of the process according to the invention is that the exposure of the printing form is not accomplished by means of the vibration-sensitive rotating mirror of a laser but by means of a vibration-insensitive, compact light emitting-diode (LED) bar, and that presensitized printing forms of high compressive strength, which have been proven in practice, can be used. Such printing forms are made so that they are characterized by high sensitivity in the visible or infrared spectral range.

Furthermore, the invention has the advantage that printing-form production and printing may be integrated into an automatically performed process. It should be emphasized in this connection that the possibility of directly integrating the exposure and developing units into the printing press dispenses with the necessity otherwise for having long conveying distances from the exposure unit to the plate cylinder.

In accordance with a further mode of the invention, the process includes performing the conveying of the printing form in the exposure unit and in the developing unit via at least one of conveyor rollers and conveyor belts.

In accordance with an added mode of the invention, the process includes unwinding the printing form from a supply roll thereof, and cutting the unwound supply roll into desired printing form sizes with a cutting device just before the printing form enters the developing unit.

In accordance with an additional mode of the invention, the process includes forming the printing form of a stamped-out sheet prior to processing.

In accordance with another feature of the invention, there is provided such a combination wherein the printing press is a small offset press, and wherein the developing unit and the exposure unit are attachable to the small offset printing press instead of to a pre-piling device for printing forms.

In accordance with a concomitant feature of the invention, there is provided such a combination wherein the printing press is an offset press, and the developing unit and the exposure unit are integrated in the offset press.

The finished printing form is automatically fed in by a high-speed printing-form feeder and is positioned on the plate cylinder, which means that preparations for printing and the printing operation itself are performed on-line without manual interventions. The attachment to the printing press of the apparatus for the production of printing forms is possible only because of the fact that, instead of the laser exposure unit with its vibration-sensitive optical components, the laser exposure unit according to the invention is formed of a vibration-insensitive, compact and sturdy LED bar.

Other features which are considered as characteristic for the invention are set forth in the appended claims.

Although the invention is illustrated and described herein as embodied in a process and apparatus for filmless production of a printing form, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the single figure of the drawing which is a diagrammatic elevational view of an exposure and developing unit attached to a small offset printing press instead of to a conventional pre-piling apparatus for printing forms Referring now to the drawing, there is shown therein, instead of a conventional pre-piling apparatus for printing forms, a closed, light-proof housing 3 attached to a printing press 15 by means of a hooking-in device 17. The housing 3 contains an exposure unit 1 and a developing unit 2. A printing form 5 is unwound from a presensitized supply roll 4 thereof and, via conveying rollers 7 and a conveyor belt 8, passes under an LED bar 6, which is rigidly fastened to a ceiling of the housing 3 transversely to a travel direction of the printing form 5 as it is being unwound. The LED bar 6 has light-emitting diodes which are controlled, in a manner true to a given image, by a non-illustrated computer, and expose the printing form 5 in accordance with pre-recorded data. Storage of the data on data carriers has a well known advantage, namely that the stored data for a job which has once been performed may be reused as often as desired for follow-up jobs.

After the printing form 5 has passed through the exposure unit 1, it is cut into desired sized or formats by a controllable cutting device 9 just before it enters the developing unit 2. In the developing unit 2, the printing form 5 passes through the usual developing stages or stations, such as a developing bath 10, a fixing bath 11 and a water bath 12, for example. Depending upon the material, the developing process may also involve a single operation, for example, in the case of developing by heat. Then, the finished printing form 5, if necessary, is dried or cooled by a blower 13, for example a fan. From a feed table 14 of the printing press 15, the printing form 5 is drawn in by a conventional device for high-speed in-feeding of printing forms and is automatically positioned on a plate cylinder 16.

The printing process itself is performed in a conventional manner. The printing form 5 is inked by a conventional inking unit which is not shown in the drawing. Then, the print is transferred from a blanket cylinder 18 onto a paper sheet 19 which is lifted from a pile 20 of the sheets 19 by means of a suction head 21 in phase with the operation of the printing press, and supplied to the printing unit 22.

The foregoing is a description corresponding in substance to German Application P 39 18 216.9, dated June 3, 1989, the International priority of which is being claimed for the instant application, and which is hereby made part of this application. Any material discrepancies between the foregoing specification and the aforementioned corresponding German application are to be resolved in favor of the latter.

I claim:

1. Process for filmless production of a ready-to-print printing form and for using it in an offset printing press, which comprises exposing a printing form sensitive in an emission range of light-emitting diodes to an image in an exposure unit by means of a computer-controlled LED bar, unwinding the printing form from a supply roll thereof, and cutting the unwound supply roll into desired printing form sizes with a cutting apparatus, thereafter passing the exposed printing form through a developing stage wherein the printing form is developed, and then feeding-in the printing form to an offset printing press via a high-speed feeding-in apparatus for printing forms, positioning the fed-in printing form on a plate cylinder of the printing press, and printing the printing form in the printing press.

* * * * *